United States Patent
Peng et al.

(10) Patent No.: US 10,504,908 B2
(45) Date of Patent: Dec. 10, 2019

(54) HIGH RELIABILITY OTP MEMORY BY USING OF VOLTAGE ISOLATION IN SERIES

(71) Applicant: SICHUAN KILOWAY ELECTRONICS INC., Mianyang (CN)

(72) Inventors: Jack Z. Peng, Chengdu (CN); Junhua Mao, Chengdu (CN); Xuyang Liao, Chengdu (CN)

(73) Assignee: SICHUAN KILOWAY ELECTRONICS INC., Mianyang (CN)

( * ) Notice: Subject to any disclaimer, the term of this patent is extended or adjusted under 35 U.S.C. 154(b) by 0 days.

(21) Appl. No.: 16/075,982

(22) PCT Filed: Feb. 18, 2016

(86) PCT No.: PCT/CN2016/074008
§ 371 (c)(1),
(2) Date: Aug. 6, 2018

(87) PCT Pub. No.: WO2017/133027
PCT Pub. Date: Aug. 10, 2017

(65) Prior Publication Data
US 2019/0341393 A1    Nov. 7, 2019

(30) Foreign Application Priority Data

Feb. 5, 2016    (CN) .......................... 2016 1 0082389

(51) Int. Cl.
*H01L 27/112* (2006.01)
*G11C 17/12* (2006.01)
*G11C 17/16* (2006.01)

(52) U.S. Cl.
CPC ........ *H01L 27/11206* (2013.01); *G11C 17/12* (2013.01); *G11C 17/16* (2013.01)

(58) Field of Classification Search
CPC .... G11C 17/12; G11C 17/16; H01L 27/11206
(Continued)

(56) References Cited

U.S. PATENT DOCUMENTS 7,593,248 B2 *  9/2009  Xu ........................ G11C 17/16
                                                    365/185.05
7,852,656 B2 * 12/2010  Shin ...................... G11C 17/18
                                                    365/225.7
(Continued)

FOREIGN PATENT DOCUMENTS

CN    101246747 A    8/2008
CN    102646450 A    8/2012
(Continued)

*Primary Examiner* — Son L Mai
(74) *Attorney, Agent, or Firm* — Gokalp Bayramoglu

(57) ABSTRACT

A high-reliability one-time programmable memory adopting series high voltage partition, which relates to integrated circuit technology and comprises a first MOS tube, a second MOS tube and an anti-fuse element, wherein a gate end of the first MOS tube is connected to a second connecting line (WS), a first connecting end of the first MOS tube is connected to a gate end of the second MOS tube and a voltage limiting device, and a second connecting end of the first MOS tube is connected to a third connecting line (BL); a first connecting end of the second MOS tube is connected to a fourth connecting line (BR), a second connecting end of the second MOS tube is connected to the third connecting line (BL), and a gate end of the second MOS tube is connected to the voltage limiting device and the second connecting end of the first MOS tube.

5 Claims, 4 Drawing Sheets

(58) Field of Classification Search
USPC .................................................. 365/96, 104
See application file for complete search history.

(56) References Cited

U.S. PATENT DOCUMENTS

| | | | | |
|---|---|---|---|---|
| 8,259,518 B2* | 9/2012 | Peng | ...................... | G11C 17/18 365/149 |
| 2003/0179623 A1 | 9/2003 | Inoue | | |

FOREIGN PATENT DOCUMENTS

| CN | 103119657 A | 5/2013 |
|---|---|---|
| CN | 103219046 A | 7/2013 |
| CN | 105957555 A | 9/2016 |

* cited by examiner

HIGH RELIABILITY OTP MEMORY BY USING OF VOLTAGE ISOLATION IN SERIES

CROSS REFERENCE TO RELATED APPLICATIONS

This application is the national phase entry of International Application PCT/CN2016/074008, filed on Feb. 18, 2016, which is based upon and claims priority to Chinese Patent Application No. 201610082389.8, filed on Feb. 5, 2016, the entire contents of which are incorporated herein by reference.

TECHNICAL FIELD

The present disclosure is directed to the integrated circuits technology. More particularly, the present disclosure is directed to the field of non-volatile memory cells, applied as the high reliable one-time programmable (OTP) memory cells and array with low voltage and low power consumption, which is the kernel element in the high frequency and ultra high frequency RFID (Radio Frequency Identification).

BACKGROUND

The Chinese Patent No. 201080067067.7 discloses a low voltage, low power memory, as shown in FIG. 1 to 3. The memory cell shows in the FIG. 1, device 1 is the selector of the MOS transistor, device 2 is the sensor of MOS transistor, and device 4 is an anti-fuse element.

The memory array in FIG. 2 consisting of four memory cells A, B, C and D. The voltages for programming and reading of cell A are listed in the Table I.

TABLE I

|  | Cell | V(WP) | V(WS) | V(BL) | V(BR) |
| --- | --- | --- | --- | --- | --- |
| Programming | A SW/SB | 5.5 V | 2.5 V | 0 V | Floating |
|  | B SWUB | 5.5 V | 2.5 V | 2.5 V | Floating |
|  | C UW/SB | 2.5 V | 0 V | 0 V | Floating |
|  | D UW/UB | 2.5 V | 0 V | 2.5 V | Floating |
| Read | A SW/SB | 1.0 V | 0 V | 0 V | V Sensing |
|  | B SW/UB | 1.0 V | 0 V | Floating | Floating |
|  | C UW/SB | 0 V | 0 V | 0 V | V Sensing |
|  | D UW/UB | 0 V | 0 V | Floating | Floating |

SW: Selected Word line,
SB: Selected Bit line,
UW: Unselected Word line,
UB: Unselected Bit line, For the prior art memory array of FIG. 3, if Cell A with Row m and Column s has been programmed, and the sequent programming is for Cell B of Row m and Column t. During the programming of Cell B, a 5.5V voltage is on the line WPm, and a high voltage about 5.2V is at Grate gms, as well as the gate of Nms, since the anti-fuse element Cms of programmed Cell A is conductive. This high voltage may cause same damage of transistor Nms of Cell A, such as leakage, reducing of reliability, etc. Low reliable Nms would results to some problem for reading of Cell A through Sense Amplifier.

SUMMARY

This invent discloses an improved OTP memory cells to solve the problem of high voltage struck in the prior art OTP.

FIG. 4 shows the technical scheme of this invent. The new structure of high reliable OTP memory cell by Using of Voltage Isolater in Series comprises the first MOS transistor (1), the second MOS transistor (2) and the anti-fuse element (4).

The gate of the first MOS transistor is connected to the second line WS. The first end of the first MOS transistor is connected to the gate of the second MOS transistor, and the second end of the first MOS transistor is connected to the third line BL.

The first end of the second MOS transistor is connected to the fourth line BR, the second end is connected to the third line BL.

In the new structure of FIG. 4, there is a voltage-limit device (3), which has one control end and two connection ends. The control end of the voltage-limit device is connected to the control line WB. One of the connection end of device (3) is connected to the first line WP across through the anti-fuse element. The other connection end of device (3) is connected to the gate of the second MOS transistor.

The voltage-limit device is the third MOS transistor (3).

The first end of the first MOS transistor is the drain, and the second end is the source.

The first end of the second MOS transistor is the drain, and the second end is the source.

The first end of the third MOS transistor is the drain, and the second end is the source.

All of the first MOS transistor, the second MOS transistor and the third MOS transistor are N-type transistors (NMOS). In the other embodiment, all of them are P-type transistors (PMOS).

This invent solves the problem of the damage and degeneration of devices in the prior art technologies. For the gate of MOS 2, there is no damage, degeneration or leakage caused by the struck of high voltage. The reliability is improved.

FIG. 5 shows a memory array consists of cells A, B, C and D having the structure of FIG. 4. The voltages for programming and reading of cell A are listed in the Table II.

Grate g is not connected to the anti-fuse element directly. During the programming of Cell B, the voltage at Grate g of Cell A is as low as 2V. This reduces the voltage struck to the MOS 2, which is the sensor of Cell A, and increases the reliability. Further more, the voltages on BL and WS are reduced from 2.5V to 1V. It results to the smaller size of the row decoders through the whole memory array.

DETAILED DESCRIPTION OF THE EMBODIMENTS

Figure 1:
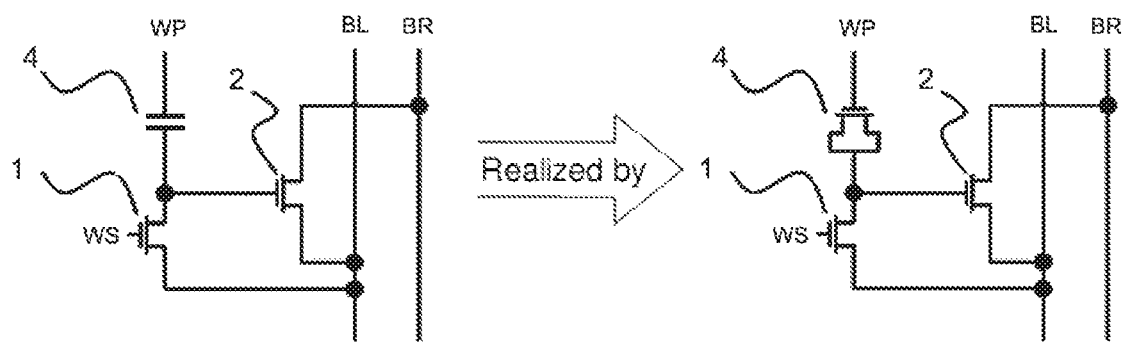
FIG. 1 shows a prior art memory cell.
Figure 2:
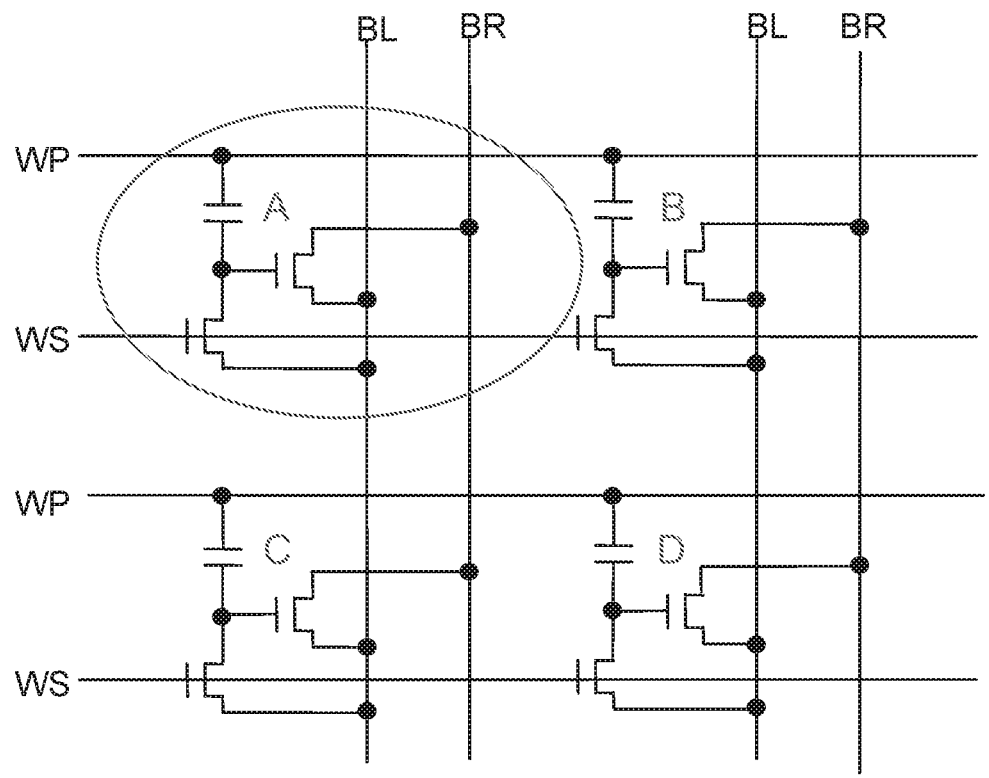
FIG. 2 shows a number of prior art memory cells in the cell array architecture.
Figure 3:
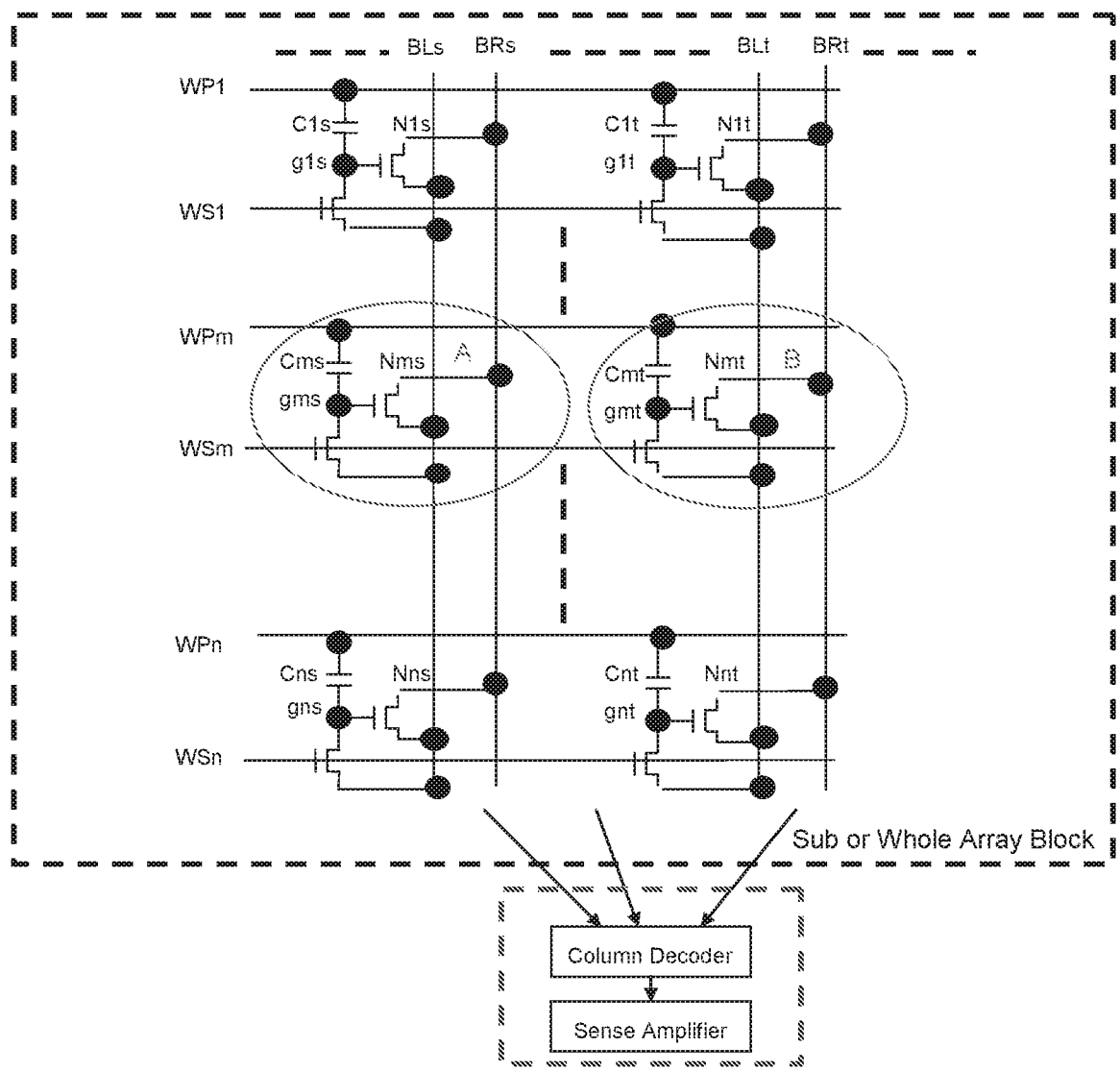
FIG. 3 shows the operation of prior art memory array.
Figure 4:
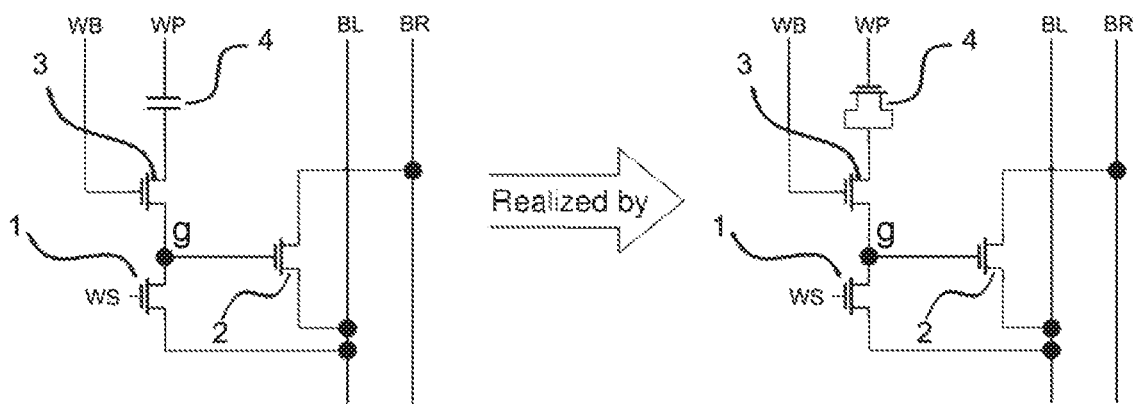
FIG. 4 shows a memory cell of EMBODIMENT 1, according to the present disclosure
Figure 5:
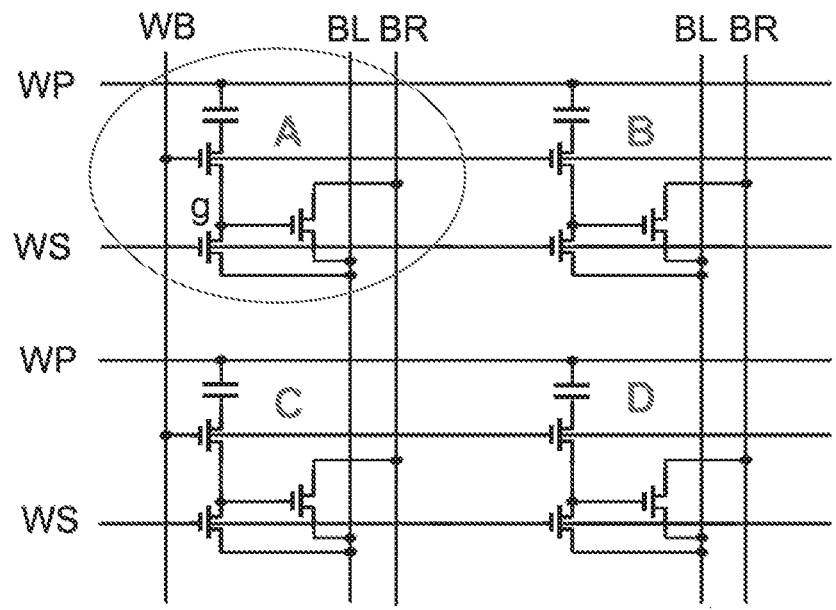
FIG. 5 shows the memory cells of FIG. 4 in the cell array architecture.
Figure 6:
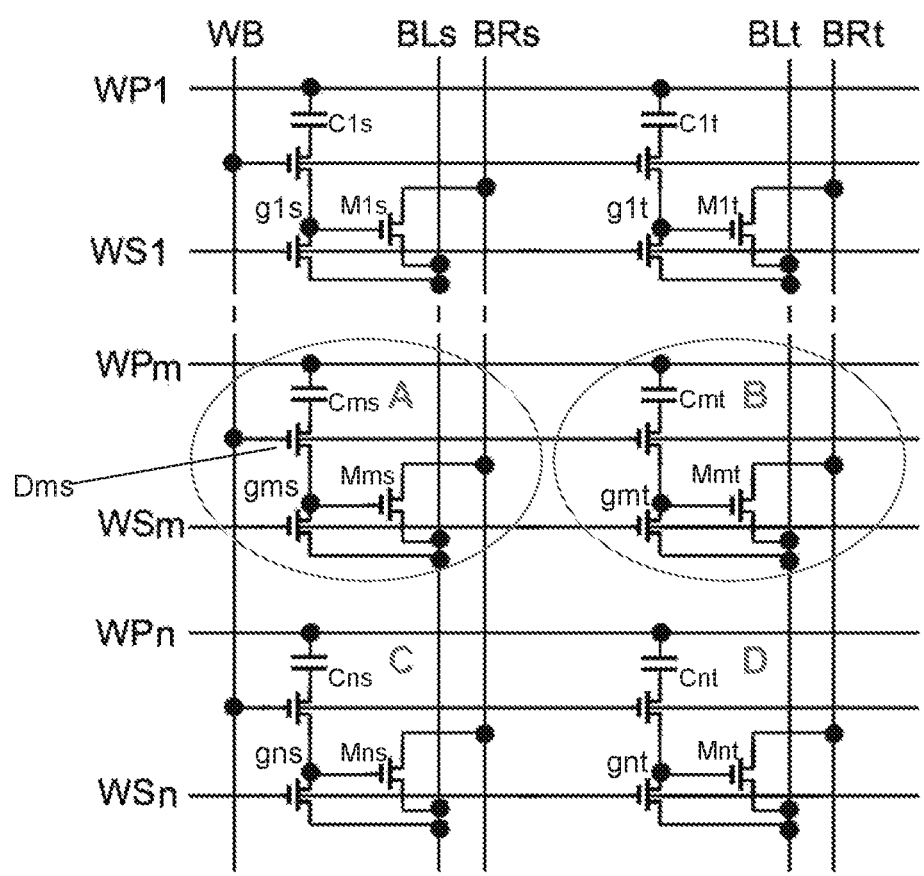
FIG. 6 shows the operation of the cell array in FIG. 5

EMBODIMENT 1 is shown in FIGS. 4 to 6.
As shown in FIG. 4, the high reliable OTP memory cell with Voltage Isolator in Series, comprises the first MOS transistor (1), the second MOS transistor (2) and the anti-fuse element (4).

The gate of the first MOS transistor is connected to the second line WS. The first end of the first MOS transistor is connected to the gate of the second MOS transistor and to the second end of the voltage limit device. The second end of the first MOS transistor is connected to the third line BL.

The first end of the second MOS transistor is connected to the fourth line BR, the second end is connected to the third line BL.

There is a voltage-limit device (3) in FIG. 4, which has one control end and two connection ends. The control end of the voltage-limit device is connected to the control line WB. One of the connection end of device (3) is connected to the anti-fuse element and the first line WP across through the anti-fuse element. The other connection end of device (3) is connected to the gate of the second MOS transistor and to the first end of the first MOS transistor.

The voltage-limit device is the third MOS transistor (3).

The first end of the first MOS transistor (1) is the drain, and the second end is the source.

The first end of the second MOS transistor (2) is the drain, and the second end is the source.

The first end of the third MOS transistor (3) is the drain, and the second end is the source.

All of the first MOS transistor, the second MOS transistor and the third MOS transistor are N-type transistors (NMOS). In the other embodiment, all of them are P-type transistors (PMOS).

All of the MOS transistors for this embodiment are symmetrical, with the source and drain mutually exchangeable. The connection end of the MOS transistor is either the source or the drain. And the control end of the MOS transistor is the gate.

The third MOS transistor of this invention is at the operation status of "ON". An appropriate setting of voltage, such as 2.5V, at the gate of MOS (3) could limit the gate voltage of the second MOS transistor.

FIG. 5 shows the memory cells of FIG. 4 in the cell array architecture; as Cells A, B, C and D. The voltages for programming and reading of cell A are listed in the Table II.

|  | Cell | V(WP) | V (WS) | V(WB) | V(BL) | V(BR) |
|---|---|---|---|---|---|---|
| Programming | A SW/SB | 5.5 V | 1 V | 2.5 V | 0 V | Floating |
|  | B SW/UB | 5.5 V | 1 V | 2.5 V | 1 V | Floating |
|  | C UW/SB | 2.5 V | 0 V | 2.5 V | 0 V | Floating |
|  | D UW/UB | 2.5 V | 0 V | 2.5 V | 1 V | Floating |
| Read | A SW/SB | 1.0 V | Pulse, 0 V | 1 V | 0 V | V Sensing |
|  | B SW/UB | 1.0 V | Pulse, 0 V | 1 V | Floating | 0 V, Floating |
|  | C SW/SB | 0 V | 0 V | 1 V | 0 V | V Sensing |
|  | C UW/UB | 0 V | 0 V | 1 V | Floating | 0 V, Floating |

As an embodiment, the operation of the memory array of FIG. 5 of this invent is described by FIG. 6.

The voltage at the control line WB remains 1V during the reading period, there is no deference from the reading of prior art technology. During the period of programming, the voltage on the control line WB is 2.5V.

Refer to FIG. 6, Cell A with Row m and Column s has been programmed, so that the anti-fuse element Cms is conductive. For the programming of Cell B with Row m and Column t, the voltages are 5.5V at WPm and 2.5V at control line WB, respectively. The drain of Dms gets a voltage more than 5V from WPm across through the conductive Cms. The voltage of 2V is at the source of Dms, as well as at Grate gms. During the programming of Cell B, the WPm voltage struck to Mms can be reduced significantly.

As the potential damage of Mms is eliminated, the further improvement would be the reduced voltage of BL and WS from 2.5V to 1V, and thereafter the smaller size of the row decoders through the whole memory array.

Figure 7:
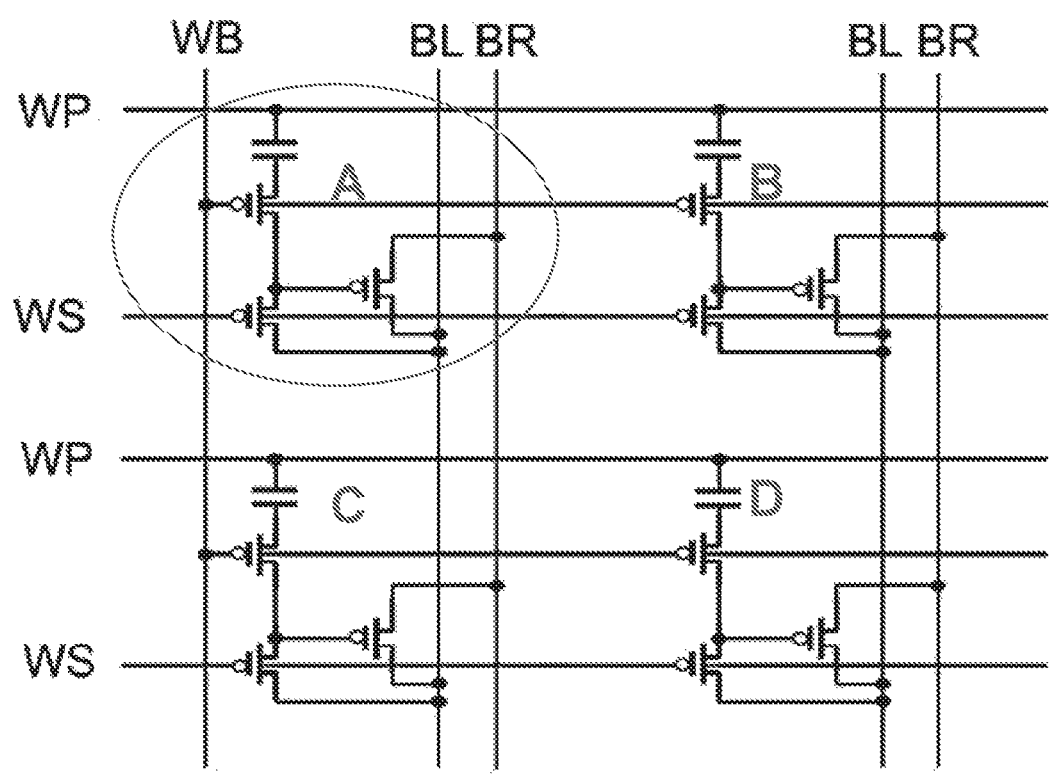
FIG. 7 shows the cell array of EMBODIMENT 2

EMBODIMENT 2 is shown in FIG. 7.

The difference from EMBODIMENT 1 is that EMBODIMENT 2 consists of PMOS transistors. For the programming and read of Cell A, the voltages in the array of FIG. 7 are listed in Table m.

TABLE III

|  | Cell | V(WP) | V(WS) | V(WB) | V(BL) | V(BR) |
|---|---|---|---|---|---|---|
| Programming | A SW/SB | −5.5 V | −1 V | −2.5 V | 0 V | Floating |
|  | B SW/UB | −5.5 V | −1 V | −2.5 V | −1 V | Floating |
|  | C UW/SB | −2.5 V | 0 V | −2.5 V | 0 V | Floating |
|  | D UW/UB | −2.5 V | 0 V | −2.5 V | −1 V | Floating |
| Read | A SW/SB | 1.0 V | 1 V, Pulse | 0 V | 0 V | V Sensing |
|  | B SW/UB | 1.0 V | 1 V, Pulse | 0 V | Floating | 0 V, Floating |
|  | C UW/SB | 0 V | 1 V, Pulse | 0 V | 0 V | V Sensing |
|  | D UW/UB | 0 V | 1 V, Pulse | 0 V | Floating | 0 V, Floating |

As noted above, It's possible in this invent that various operation voltage are applied, depending on the type of MOS transistor as well as the process technology. The MOS transistors in the memory cell might be the P-type, N-type or even the mixed type, and thereafter the operating voltages might be positive or negative. The voltages listed in Table I, Table II and Table III are for the particular embodiment only. Various operation voltage may applied for further embodiments of this invent.

While this invention has been particularly shown and described with references to a preferred embodiment thereof, it will be understood by those skilled in the art that is made therein without departing from the spirit and scope of the invention as defined by the following claims.

What is claimed is:

1. A high reliable OTP memory by using of Voltage Isolation in Series, comprising: a first MOS transistor, a second MOS transistor and a anti-fuse element, wherein
a gate of the first MOS transistor is connected to a second line WS, a first end of the first MOS transistor is connected to a gate of the second MOS transistor, and to a voltage limit device, a second end of the first MOS transistor is connected to a third line BL;
a first end of the second MOS transistor is connected to a fourth line BR, and a second end of the second MOS transistor is connected to the third line BL, the gate of the second MOS transistor is connected to the voltage limit device and to the second end of the first MOS transistor;
the high reliable OTP memory by using of Voltage Isolation in Series further comprises the voltage-limit device having one control end and two connection ends, the control end of the voltage-limit device is connected to a control line WB, a first connection end of the voltage-limit device is connected to the anti-fuse element and a first line WP across through the anti-fuse element, a second connection end of the voltage-limit device is connected to the gate of the second MOS transistor and to the first end of the first MOS transistor.

2. The high reliable OTP memory of claim 1, wherein the voltage-limit device is a third MOS transistor.

3. The high reliable OTP memory of claim 2, wherein first end of the first MOS transistor is a first drain, and the second end of the first MOS transistor is a first source; the first end of the second MOS transistor is a second drain, and the second end of the second MOS transistor is a second source; a first end of the third MOS transistor is a third drain, and a second end of the third MOS transistor is a third source.

4. The high reliable OTP memory of claim 2, wherein all of the first MOS transistor, the second MOS transistor and the third MOS transistor are N-type transistors (NMOS) or P-type transistors (PMOS).

5. The high reliable OTP memory of claim 2, wherein all of the first MOS transistor, the second MOS transistor and the third MOS transistor are symmetrical MOS transistors.

* * * * *